(12) United States Patent
Oohira

(10) Patent No.: US 8,704,103 B2
(45) Date of Patent: Apr. 22, 2014

(54) DISPLAY DEVICE

(75) Inventor: Eiji Oohira, Mobara (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 256 days.

(21) Appl. No.: 13/272,314

(22) Filed: Oct. 13, 2011

(65) Prior Publication Data

US 2012/0099283 A1 Apr. 26, 2012

(30) Foreign Application Priority Data

Oct. 21, 2010 (JP) ................................ 2010-236351

(51) Int. Cl.
*H05K 1/16* (2006.01)

(52) U.S. Cl.
USPC ............ 174/260; 174/94 S; 345/88; 345/173; 345/174; 345/204; 349/43; 349/58; 349/74; 349/106; 349/110; 361/679.01; 361/679.26; 361/749; 362/611

(58) Field of Classification Search
USPC .......... 174/260, 94 S; 345/88, 173, 174, 204; 349/43, 58, 74, 106, 110; 361/679.01, 361/679.26, 749; 362/611
See application file for complete search history.

(56) References Cited

U.S. PATENT DOCUMENTS

| | | | |
|---|---|---|---|
| 6,411,353 B1* | 6/2002 | Yarita et al. ..................... 349/59 |
| 2001/0000763 A1* | 5/2001 | Muramatsu .................... 439/74 |
| 2004/0222974 A1* | 11/2004 | Hong et al. .................. 345/173 |
| 2005/0094052 A1* | 5/2005 | Sakurai et al. .................. 349/58 |
| 2005/0213924 A1* | 9/2005 | Sakurai et al. ................ 385/147 |
| 2006/0119761 A1* | 6/2006 | Okuda ............................ 349/58 |
| 2006/0133018 A1* | 6/2006 | Okuda .......................... 361/681 |
| 2006/0139271 A1* | 6/2006 | Okuda ............................ 345/88 |
| 2007/0146570 A1 | 6/2007 | Yu et al. |
| 2007/0252922 A1* | 11/2007 | Oohira ........................... 349/58 |
| 2008/0043413 A1* | 2/2008 | Okuda .......................... 361/681 |
| 2008/0068785 A1* | 3/2008 | Noguchi et al. .............. 361/681 |
| 2008/0117367 A1* | 5/2008 | Abe .............................. 349/106 |
| 2008/0136995 A1* | 6/2008 | Oohira ........................... 349/58 |
| 2008/0151138 A1* | 6/2008 | Tanaka ........................... 349/58 |
| 2008/0198289 A1* | 8/2008 | Oohira ........................... 349/46 |
| 2009/0061166 A1* | 3/2009 | Ayukawa ...................... 428/194 |

(Continued)

FOREIGN PATENT DOCUMENTS

| | | |
|---|---|---|
| JP | 2000-187239 | 7/2000 |
| JP | 2005-055512 | 3/2005 |

(Continued)

*Primary Examiner* — Xiaoliang Chen
(74) *Attorney, Agent, or Firm* — Antonelli, Terry, Stout & Kraus, LLP.

(57) ABSTRACT

A display device includes: a display panel; a metal frame; and a flexible printed wiring board fixed to the display panel and having a portion positioned between a lower surface of the display panel and the metal frame, in which the flexible printed wiring board includes: a protruding piece portion having a protruding length larger than a width in plan view; an electrode arranged on the protruding piece portion; a connection terminal electrically connected to the display panel; an external terminal for electrically connecting to an outside; and a wiring pattern connected to the electrode, the connection terminal, and the external terminal, and in which the electrode is electrically and physically bonded to the metal frame in a manner opposed to the metal frame, and is arranged at a position overlapping with a center of a surface of the metal frame facing the display panel.

7 Claims, 3 Drawing Sheets

(56) References Cited

U.S. PATENT DOCUMENTS

| | | | |
|---|---|---|---|
| 2009/0080148 A1* | 3/2009 | Sugawara | 361/679.02 |
| 2010/0060816 A1* | 3/2010 | Fukai et al. | 349/58 |
| 2010/0085326 A1* | 4/2010 | Anno | 345/174 |
| 2010/0265430 A1* | 10/2010 | Xu | 349/58 |
| 2011/0058120 A1* | 3/2011 | Oohira | 349/61 |
| 2011/0095999 A1* | 4/2011 | Hayton | 345/173 |
| 2011/0120770 A1* | 5/2011 | Yokonuma | 174/94 S |
| 2011/0122651 A1* | 5/2011 | Komano | 362/611 |
| 2011/0149190 A1* | 6/2011 | Kim | 349/58 |
| 2011/0157512 A1* | 6/2011 | Mishima | 349/58 |

FOREIGN PATENT DOCUMENTS

| | | |
|---|---|---|
| JP | 2009-031464 | 2/2009 |
| JP | 2009-205080 | 9/2009 |
| WO | WO 2010/021200 | 2/2010 |

* cited by examiner

DISPLAY DEVICE

CROSS-REFERENCE TO RELATED APPLICATION

The present application claims priority from Japanese application JP 2010-236351 filed on Oct. 21, 2010, the content of which is hereby incorporated by reference into this application.

BACKGROUND OF THE INVENTION

1. Field of the Invention

The present invention relates to a display device.

2. Description of the Related Art

Conventionally, there has been known a liquid crystal display device having a structure in which a liquid crystal display panel is housed in a metal frame. When the metal frame is electrostatically charged, the metal frame exerts influence on the liquid crystal display panel, and hence the metal frame is preferred to be electrically connected to a ground (GND) and the like. Japanese Patent Application Laid-open No. 2009-205080 discloses a structure in which the metal frame and a flexible printed wiring board connected to the liquid crystal display panel are electrically connected to each other via a conductive cushioning member.

However, the conductive cushioning member is expensive, and further, there is a risk that electrical connection cannot be ensured when an impact is received.

SUMMARY OF THE INVENTION

The present invention has an object to provide a display device capable of ensuring reliable electrical connection between a metal frame and a flexible printed wiring board without increasing a cost.

(1) A display device according to the present invention includes: a display panel, which has an upper surface including a display region and a lower surface on a side opposite to the upper surface; a metal frame, which has a portion overlapping with the lower surface of the display panel; and a flexible printed wiring board, which is fixed to the display panel and has a portion positioned between the lower surface of the display panel and the metal frame, in which the flexible printed wiring board includes: a protruding piece portion, which has a protruding length larger than a width in plan view; an electrode, which is arranged on the protruding piece portion; a connection terminal, which is electrically connected to the display panel; an external terminal for electrically connecting to an outside; and a wiring pattern, which is connected to the electrode, the connection terminal, and the external terminal, and in which the electrode is electrically and physically bonded to the metal frame in a manner opposed to the metal frame, and is arranged at a position overlapping with a center of a surface of the metal frame facing the display panel. According to the present invention, the protruding piece portion is shaped so that the protruding length is larger than the width, and hence the protruding piece portion can easily follow the movement of the metal frame bonded thereto, thereby ensuring electrical connection therebetween. Further, a conductive cushioning member is unnecessary, and hence it is possible to avoid cost increase.

(2) In the display device according to the above-mentioned item (1), the electrode may be bonded to the metal frame with a bonding member having conductivity.

(3) In the display device according to the above-mentioned item (2), the bonding member may include at least one of a pressure-sensitive adhesive, an adhesive, and a brazing filler metal.

(4) In the display device according to any one of the above-mentioned items (1) to (3), the flexible printed wiring board may be fixed to an end portion of the upper surface of the display panel, and may be bent to extend under the lower surface.

(5) In the display device according to any one of the above-mentioned items (1) to (4), the wiring pattern of the flexible printed wiring board may be arranged on each of both surfaces of a substrate, the electrode may be arranged on a surface of the substrate facing the metal frame, and the wiring pattern arranged on a surface of the substrate facing a side opposite to the metal frame may be formed so as to avoid overlapping with the electrode.

DETAILED DESCRIPTION OF THE INVENTION

Hereinafter, an embodiment of the present invention is described with reference to the drawings.

Figure 1:
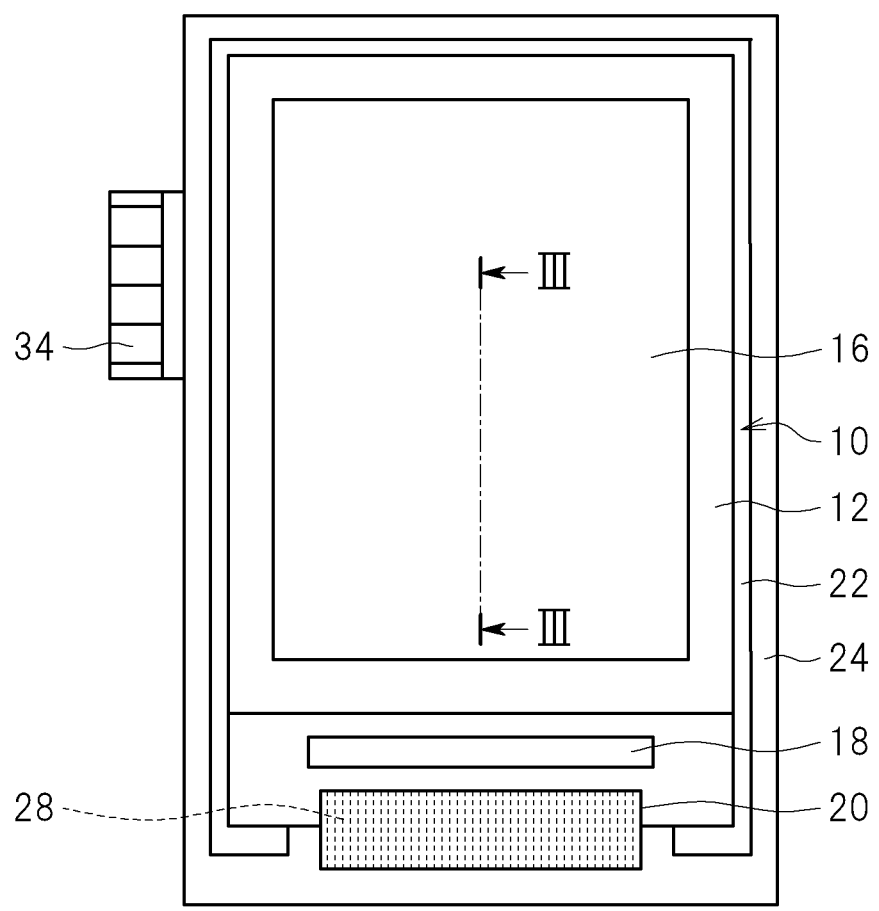
FIG. 1 is a plan view illustrating a display panel according to an embodiment of the present invention.

FIG. 1 is a plan view illustrating a display panel according to the embodiment of the present invention. A display device includes a display panel 10. In this embodiment, the display panel 10 is a liquid crystal display panel, but as a modification example, an organic electroluminescence display panel or the like may be used.

The display panel 10 has an upper surface 12 and a lower surface (not shown) on a side opposite to the upper surface 12. The upper surface 12 is a surface including a display region at which an image is displayed. A polarizing plate 16 is adhered onto the upper surface 12. Onto the display panel 10, an integrated circuit chip 18 having a driver circuit built therein is mounted, and a flexible printed wiring board 20 is fixed.

The liquid crystal display device includes an inner frame 22 made of, for example, a resin. The display panel 10 is fixed to the inner frame 22. Specifically, the inner frame 22 has a frame shape, and the display panel 10 is adhered onto the inner frame 22 so as to cover a space inside the frame.

In FIG. 1, a metal frame 24 is arranged below the display panel 10 (on the lower surface side of the display panel 10). The metal frame 24 has a portion overlapping with the lower surface of the display panel 10.

Figure 2:
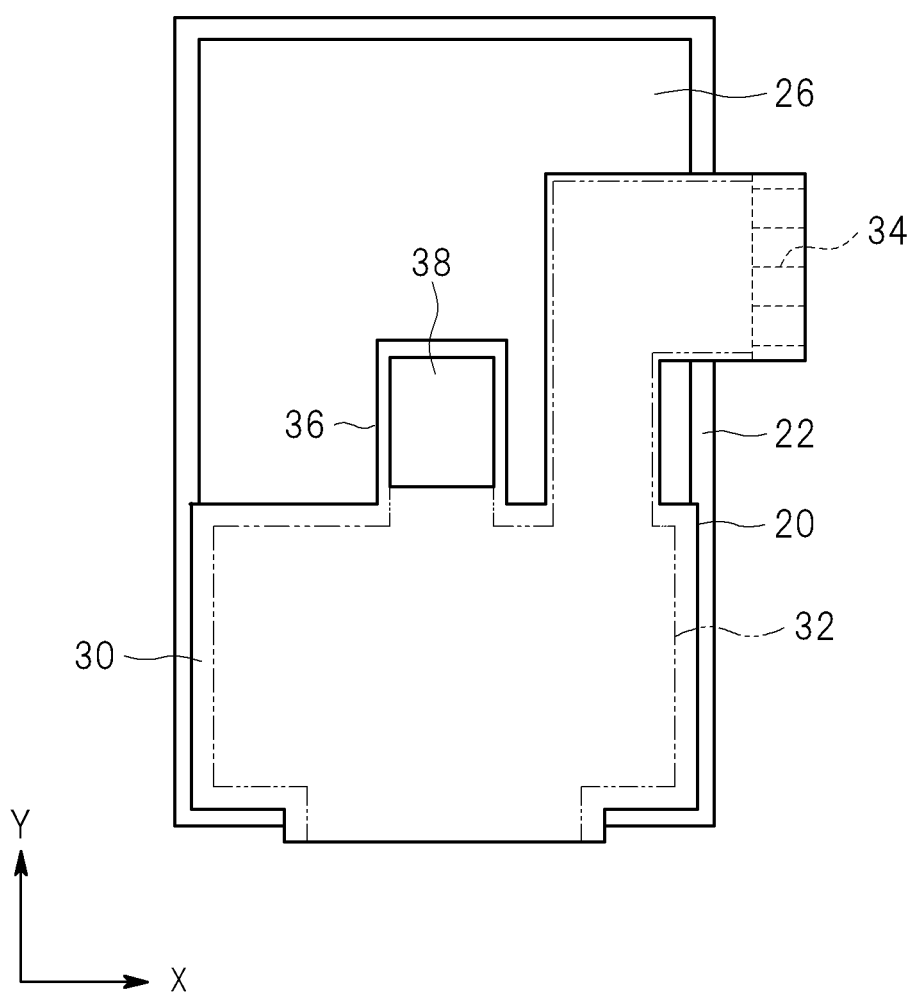
FIG. 2 is a view illustrating a state in which a metal frame is detached from the display device illustrated in FIG. 1 when viewed from a lower side.
Figure 3:
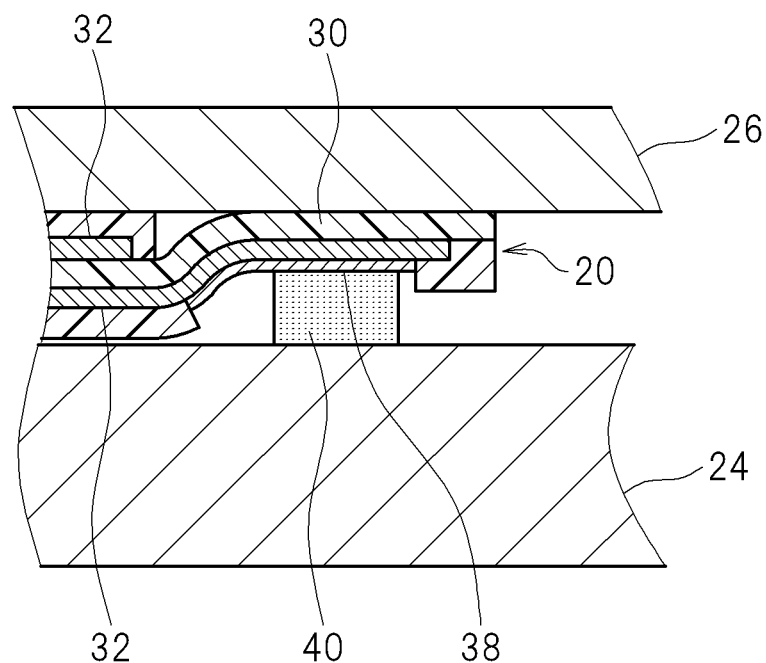
FIG. 3 is a view illustrating a part of a cross section taken along the line III-III of the display device illustrated in FIG. 1.

FIG. 2 is a view illustrating a state in which the metal frame 24 is detached from the display device illustrated in FIG. 1 when viewed from a lower side. FIG. 3 is a view illustrating a part of a cross section taken along the line III-III of the display device illustrated in FIG. 1.

The flexible printed wiring board 20 is fixed to an end portion of the upper surface 12 of the display panel 10, and is bent to extend under the lower surface. Therefore, the flexible printed wiring board 20 has a portion positioned between the lower surface of the display panel 10 and the metal frame 24. Note that, in FIG. 2, a reflection sheet 26 is arranged below the flexible printed wiring board 20, and a light guide plate (not shown) (part of backlight unit) is arranged below the reflection sheet 26. That is, from the display panel 10 side, an optical sheet group, the light guide plate, the reflection sheet 26, and the flexible printed wiring board 20 are arranged in the stated order.

As illustrated in FIG. 1, the flexible printed wiring board 20 includes a connection terminal 28. The connection terminal 28 is arranged at an end portion of the flexible printed wiring board 20, and is electrically and physically connected to the display panel 10. The flexible printed wiring board 20 is bent from the portion at which the connection terminal 28 is provided around an end portion of the display panel 10 toward the lower surface of the display panel 10.

The flexible printed wiring board 20 includes a wiring pattern 32 formed on a substrate 30. The connection terminal 28 is electrically connected to the wiring pattern 32. The flexible printed wiring board 20 further includes an external terminal 34 for electrically connecting to an outside. The external terminal 34 is also electrically connected to the wiring pattern 32. As illustrated in FIG. 1, at least a part of the external terminal 34 is arranged outside the metal frame 24.

In the example illustrated in FIG. 2, the substrate 30 of the flexible printed wiring board 20 extends from a direction orthogonal to a center axis (axis extending along an X direction in FIG. 2) of the bending of the flexible printed wiring board 20 and parallel to the lower surface of the display panel 10 (direction along Y in FIG. 2), toward a direction intersecting with the above-mentioned direction (right direction in FIG. 2). The external terminal 34 is arranged at a leading end portion of the flexible printed wiring board 20.

As illustrated in FIG. 2, the flexible printed wiring board 20 includes a protruding piece portion 36 in a region overlapping with the display panel 10 in plan view. The protruding piece portion 36 has a protruding length (length along the Y direction of FIG. 2) larger than a width (length along the X direction of FIG. 2), and hence the protruding piece portion 36 is easily bent. The protruding piece portion 36 is protruded in a direction separating from a portion of the flexible printed wiring board 20 bent around the end portion of the display panel 10. Further, a base of the protruding piece portion 36 is positioned closer to an end portion of the inner frame 22 or the metal frame 24 relative to a center of the inner frame 22 or the metal frame 24.

An electrode 38 is formed on the protruding piece portion 36. The wiring pattern 32 is also electrically connected to the electrode 38. The electrode 38 is formed on a surface of the substrate 30 facing the metal frame 24. As illustrated in FIG. 3, the electrode 38 is electrically and physically bonded to the metal frame 24 in a manner opposed to the metal frame 24. The electrode 38 is bonded to the metal frame 24 with a bonding member 40 having conductivity. The bonding member 40 is at least one of a pressure-sensitive adhesive such as a conductive tape, an adhesive, and a brazing filler metal. The electrode 38 is arranged at a position overlapping with a center of a surface of the metal frame 24 facing the display panel 10.

As illustrated in FIG. 3, the flexible printed wiring board 20 includes the wiring pattern 32 on each of both surfaces of the substrate 30. The wiring pattern 32 arranged on the surface of the substrate 30 facing a side opposite to the metal frame 24 is formed so as to avoid overlapping with the electrode 38. Therefore, in the region at which the electrode 38 is formed, the flexible printed wiring board 20 is formed of a single layer substrate, and hence is formed thin. As illustrated in FIG. 3, the protruding piece portion 36 is bent. Specifically, the surface of the protruding piece portion 36 on which the electrode 38 is formed is pressed by the metal frame 24 via the bonding member 40, thereby bending the substrate 30.

Figure 4:
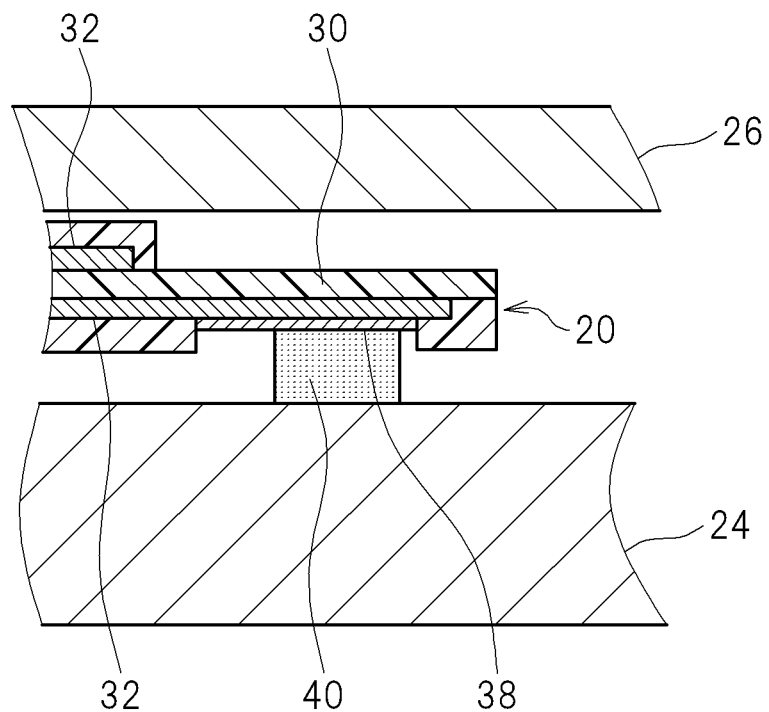
FIG. 4 is a view illustrating a flexible printed wiring board arranged at a position different from a position as designed.

FIG. 4 is a view illustrating the flexible printed wiring board 20 arranged at a position different from a position as designed. In many cases, the metal frame 24 is formed by processing a metal plate, and there is a case where the metal plate is prepared in a rolled shape. In this case, the metal plate is curved, and hence the surface of the metal frame 24 opposed to the flexible printed wiring board 20 may not be flat. Additionally, when the display device is used, the metal frame 24 may be liable to detach when an impact is applied. In those cases, the position of the metal frame 24 differs from a design value.

FIG. 4 illustrates a case where the position of the flexible printed wiring board 20 is outwardly offset relative to the design value. In this case, the metal frame 24 is offset in a direction separating from the flexible printed wiring board 20. However, the metal frame 24 and the electrode 38 are bonded to each other, and hence the protruding piece portion 36 follows the metal frame 24 via the electrode 38. Specifically, the protruding piece portion 36, which is supposed to bend in a direction opposite to the metal frame 24 as illustrated in FIG. 3, is deformed so that the protruding piece portion 36 returns to its original shape as illustrated in FIG. 4. When the metal frame 24 is further separated from the flexible printed wiring board 20, the protruding piece portion 36 is bent in a direction of the metal frame 24 (not shown).

In this embodiment, when the metal frame 24 is positioned as designed, the protruding piece portion 36 is bent in the direction separating from the metal frame 24 (see FIG. 3). Therefore, when the metal frame 24 is separated, the protruding piece portion 36 is bent in an opposite direction. That is, the protruding piece portion 36 can be bent in both directions, and hence a range within which the protruding piece portion 36 can follow the metal frame 24 is wide.

According to this embodiment, the protruding piece portion 36 is shaped so that the protruding length is larger than the width, and hence the protruding piece portion 36 can easily follow the movement of the metal frame 24 bonded thereto, thereby ensuring electrical connection therebetween. Further, a conductive cushioning member is unnecessary, and hence it is possible to avoid cost increase.

The present invention is not limited to the embodiment described above, and various modifications may be made thereto. For example, the structure described in the embodiment may be replaced by substantially the same structure, a structure providing the same action and effect, and a structure which may achieve the same object.

What is claimed is:
1. A display device, comprising:
  a display panel, which has an upper surface including a display region and a lower surface on a side opposite to the upper surface;
  a metal frame, which has a portion overlapping with the lower surface of the display panel; and
  a flexible printed wiring board, which is fixed to the display panel and has a first portion positioned between the lower surface of the display panel and the metal frame,
  wherein the flexible printed wiring board comprises:
    a protruding piece portion, which protrudes from the first portion of the flexible printed wiring board and has a protruding length larger than a protruding width in plan view, the protruding width of the protruding piece portion being smaller than a width of the first portion of the flexible printed wiring board in plan view;

an electrode, which is arranged on the protruding piece portion;

a connection terminal, which is electrically connected to the display panel;

an external terminal for electrically connecting to an outside; and a wiring pattern, which is connected to the electrode, the connection terminal, and the external terminal, and wherein the electrode which is arranged on the protruding piece portion of the first portion of the flexible printed wiring board is electrically and physically bonded to the metal frame in a manner opposed to the metal frame, and is arranged at a position overlapping with a center of a surface of the metal frame facing the display panel in plan view.

2. The display device according to claim 1, wherein the electrode is bonded to the metal frame with a bonding member having conductivity.

3. The display device according to claim 2, wherein the bonding member comprises at least one of a pressure-sensitive adhesive, an adhesive, and a brazing filler metal.

4. The display device according to claim 1, wherein the flexible printed wiring board is fixed to an end portion of the upper surface of the display panel, and is bent to extend under the lower surface.

5. The display device according to claim 1, wherein the wiring pattern of the flexible printed wiring board is arranged on each of both surfaces of a substrate of the flexible printed wiring board, wherein the electrode is arranged on a surface of the substrate facing the metal frame, and wherein the wiring pattern arranged on a surface of the substrate facing a side opposite to the metal frame is formed so as to avoid overlapping with the electrode.

6. The display device according to claim 1, wherein the protruding piece portion of the first portion of the flexible printed wiring board is bent in a direction away from the metal frame.

7. The display device according to claim 1, wherein the protruding piece portion of the first portion of the flexible printed wiring board is bent toward the lower surface of the display panel.

\* \* \* \* \*